United States Patent
Shimazaki et al.

(10) Patent No.: US 10,870,132 B2
(45) Date of Patent: Dec. 22, 2020

(54) CLEANING SPONGE AND CLEANING METHOD

(71) Applicant: AION CO., LTD., Osaka (JP)

(72) Inventors: Yuuichi Shimazaki, Ibaraki (JP);
Tadashi Kawaguchi, Ibaraki (JP);
Hidehiko Tsukada, Ibaraki (JP)

(73) Assignee: AION CO., LTD

( * ) Notice: Subject to any disclaimer, the term of this patent is extended or adjusted under 35 U.S.C. 154(b) by 74 days.

(21) Appl. No.: 15/689,751

(22) Filed: Aug. 29, 2017

(65) Prior Publication Data

US 2017/0354995 A1    Dec. 14, 2017

Related U.S. Application Data

(62) Division of application No. 13/389,845, filed as application No. PCT/JP2010/063718 on Aug. 12, 2010, now abandoned.

(30) Foreign Application Priority Data

Aug. 20, 2009 (JP) .................................. 2009-191422
Mar. 16, 2010 (JP) .................................. 2010-058700

(51) Int. Cl.
*B08B 1/00* (2006.01)
*H01L 21/02* (2006.01)
(Continued)

(52) U.S. Cl.
CPC ................. *B08B 1/001* (2013.01); *B08B 1/04* (2013.01); *B08B 3/08* (2013.01); *B08B 3/10* (2013.01);
(Continued)

(58) Field of Classification Search
CPC .. B08B 1/001; B08B 1/04; B08B 3/08; B08B 3/10; B08B 11/00; C08F 20/10;
(Continued)

(56) References Cited

U.S. PATENT DOCUMENTS 3,190,843 A    6/1965    Hofelmann et al.
6,080,092 A    6/2000    Cercone et al.
(Continued)

FOREIGN PATENT DOCUMENTS

CN    1246814 A    3/2000
EP    0 937 509 A1    8/1999
(Continued)

OTHER PUBLICATIONS

USPTO Non-Final Office Action issued in related U.S. Appl. No. 13/389,845, dated Jan. 7, 2016.

(Continued)

*Primary Examiner* — Sharidan Carrillo
(74) *Attorney, Agent, or Firm* — Valeriya Svystun; Day Pitney LLP (57) ABSTRACT

A sponge roller is made of a polyvinyl acetal porous resin material having elasticity in a wet state, includes a roller in an approximate cylinder form and a plurality of protrusions formed integrally on an outer peripheral surface of the roller, and rotates the multiple protrusions to make contact with a surface to be cleaned so as to clean the surface. The polyvinyl acetal porous resin material constituting the sponge roller contains a cationic functional group.

9 Claims, 7 Drawing Sheets

(51) Int. Cl.
*H01L 21/67* (2006.01)
*B08B 1/04* (2006.01)
*B08B 3/10* (2006.01)
*B08B 3/08* (2006.01)
*B08B 11/00* (2006.01)
*C08F 20/10* (2006.01)

(52) U.S. Cl.
CPC .............. *B08B 11/00* (2013.01); *C08F 20/10* (2013.01); *H01L 21/02057* (2013.01); *H01L 21/02096* (2013.01); *H01L 21/67046* (2013.01)

(58) Field of Classification Search
CPC ......... H01L 21/02057; H01L 21/02096; H01L 21/67046
See application file for complete search history.

(56) References Cited

U.S. PATENT DOCUMENTS

| | | | | |
|---|---|---|---|---|
| 6,502,273 | B1 * | 1/2003 | Mihara | B08B 1/04 15/102 |
| 6,523,210 | B1 * | 2/2003 | Andros | B08B 1/04 134/1.3 |
| 6,598,255 | B1 * | 7/2003 | Gohda | A46B 13/008 15/102 |
| 6,818,604 | B2 * | 11/2004 | Emesh | B08B 1/04 510/175 |
| 2002/0046434 | A1 * | 4/2002 | Murakami | B08B 1/04 15/77 |
| 2003/0046783 | A1 * | 3/2003 | Chen | C08J 9/26 15/244.4 |
| 2011/0265279 | A1 * | 11/2011 | Kawaguchi | A46B 9/005 15/244.4 |
| 2016/0193631 | A1 * | 7/2016 | Shimazaki | H01L 21/02096 134/6 |

FOREIGN PATENT DOCUMENTS

| | | | | |
|---|---|---|---|---|
| EP | 0937509 | A1 * | 8/1999 | .............. B08B 1/04 |
| EP | 1188492 | A1 * | 3/2002 | .............. B08B 1/04 |
| JP | 08-231754 | A | 9/1996 | |
| JP | 08-306650 | A | 11/1996 | |
| JP | 2000-033623 | A | 2/2000 | |
| JP | 2002-299300 | A | 10/2002 | |
| JP | 3378015 | B2 | 2/2003 | |
| JP | 2004-084056 | A | 3/2004 | |
| JP | 2006-278392 | A | 10/2006 | |
| JP | 2008-270360 | A | 11/2008 | |
| KR | 2006-0103841 | A | 10/2006 | |
| WO | WO-2010001761 | A1 * | 1/2010 | ............. A46B 9/005 |

OTHER PUBLICATIONS

USPTO Non-Final Office Action issued in related U.S. Appl. No. 15/000,434, dated Feb. 22, 2018.
KIPO Office Action for related Korean application No. 10-2012-7003600, dated Jan. 27, 2016 with computer generated English translation.
Taiwan IPO Office Action for related Taiwan application No. 10-420291150, dated Mar. 6, 2015. English translation unavailable.
International Search Report and Written Opinion of related international application, PCT/JP2010/063718, dated Nov. 16, 2010 (English Translation).

* cited by examiner

CLEANING SPONGE AND CLEANING METHOD

RELATED APPLICATIONS

This application is a divisional application of, and claims priority to, U.S. Non-Provisional application Ser. No. 13/389,845, filed Feb. 10, 2012, which itself is a National Stage application of PCT Application No. PCT/JP10/63718, filed Aug. 12, 2010, which itself claims priority to Japanese Application No. 2009-191422, filed Aug. 20, 2009, and Japanese Application No. 2010-058700, filed Mar. 16, 2010, the disclosures and teachings of which are all incorporated herein by reference.

TECHNICAL FIELD

The present invention relates to a cleaning sponge mainly used in scrub cleaning in a cleaning step of a manufacturing process of electronics components, such as semiconductor electronic device wafer, silicon wafer, or a hard disk, for example, and a cleaning method utilizing the cleaning sponge.

BACKGROUND ART

In recent years, there has been remarkable improvement in accuracy in various components in the electronic industry, and accordingly, there has been increasing demand for capability of cleaning the manufacturing environment. Especially, since chemical contamination and adhered particles on the surface of components greatly effects the yield and reliability of operation of products, significance of the cleaning step in the manufacturing process is great, and various cleaning methods are therefore being developed.

For example, as a method of cleaning the surface of an object such as semiconductor electronic device wafer, silicon wafer, or hard disk, scrub cleaning using a sponge roller, which is made of a polyvinyl acetal porous material, for example, and has an elastic, cylindrical roller fixed to the outer circumference of a rotary shaft, and multiple protrusions formed integrally on the outer peripheral surface of the roller is well known. Scrub cleaning means to brush and clean by bringing the multiple protrusions of the outer circumference portion of the roller into contact with the surface to be cleaned, and rotating the sponge cleaner via the rotary shaft while supplying water or other cleaning liquid to the contact portions thereof.

SUMMARY OF THE INVENTION

Problem To Be Solved By the Invention

Firmly pressing the sponge roller against the object to be cleaned so as to brush and clean for assured removal of microscopic particles existing on the surface to be cleaned is possible during the scrub cleaning.

However, if the sponge roller is firmly pressed against the surface to be cleaned, physical damage thereto may increase.

Therefore, an objective of the present invention is to provide a cleaning sponge capable of improving efficiency of cleaning during the cleaning process, and reducing damage of a surface to be cleaned.

Means of Solving the Problem

In order to reach the above objective, a cleaning sponge according to a first aspect of the present invention is made of a polyvinyl acetal porous resin material having elasticity in a wet state and is used to rub against a surface to be cleaned so as to clean that surface. The polyvinyl acetal porous resin material includes an anionic functional group.

The sponge may have a roller form including an approximately cylindrical roller and multiple protrusions formed integrally on the outer surface of the roller. In this case, the surface to be cleaned is cleaned by rotating the protrusions to touch that surface.

The anionic functional group preferably includes at least one of a carboxyl group, a sulfo group, a sulfate group, and a phosphate group, where it is particularly preferable to include a carboxyl group.

Alternatively, zeta potential of the polyvinyl acetal porous resin material may be −30 mV or less (absolute value of 30 or greater) under a condition of pH 7.

During scrub cleaning using the cleaning sponge, the cleaning sponge is rubbed against the surface to be cleaned while supplying various cleaning liquids on the surface to be cleaned. Scrub cleaning is processing carried out for removing from the surface to be cleaned particles mainly of a slurry abrasive after chemical mechanical polishing (CMP) of the surface using the slurry abrasive and a urethane pad or the like. Purified water, an alkaline solution (e.g., ammonia water), or an acidic solution (e.g., dilute fluorinated acid) is used as a cleaning liquid. Moreover, $SiO_2$, $Al_2O_3$, $CeO_2$, $Mn_2O_3$ and the like are used as grains in the abrasive supplied during CMP.

The zeta potential of the cleaning sponge (polyvinyl acetal porous resin material) and the zeta potential of the respective grains change respectively in accordance with the pH of the cleaning liquid. Under a predetermined condition (in an environment where the cleaning liquid has a predetermined pH), an electrical repulsion force acts between the grains and the sponge roller if the zeta potential of the cleaning sponge and the zeta potential of the respective grains are homopolar (either both positive or negative), and electrical adsorptivity acts if they are heteropolar (one is positive and the other is negative). The greater the electrical repulsive force and the electrical adsorptivity, the larger the absolute value of the zeta potential of the sponge roller. Moreover, the chemical repulsive force and the adsorptivity also act between the grains and the sponge.

In this case, since the polyvinyl acetal porous resin material constituting the cleaning sponge according to the first aspect of the present invention contains an anionic functional group, polyvinyl acetal porous resin material not containing an anionic functional group has different correspondence to pH and zeta potentials (referred to as zeta potential characteristics hereafter). For example, in a certain cleaning environment, in the case where the zeta potential of the cleaning sponge containing an anionic functional group (referred to as anionic cleaning sponge hereafter) and zeta potential of the cleaning sponge not containing an anionic functional group (referred to as non-anionic cleaning sponge hereafter) are homopolar (either both positive or negative) and the absolute value of the zeta value of the anionic cleaning sponge is greater than that of the non-anionic cleaning sponge, the repulsive force or the adsorptivity acting between the anionic sponge and the grains is greater than that acting between the non-anionic sponge and the grains. Moreover, in a certain cleaning environment, in the case where the zeta potentials of the anionic cleaning sponge and the non-anionic cleaning sponge are heteropolar (one is positive and the other is negative), if the zeta potentials of the anionic cleaning sponge and the grains are homopolar, a repulsive force acts between the anionic sponge and the grains and adsorptivity acts between the non-anionic sponge and the grains, and if the zeta potentials of the anionic cleaning sponge and the grains are heteropolar, adsorptivity acts between the anionic sponge and the grains and a repulsive force acts between the non-anionic sponge and the grains.

In this manner, since zeta potential characteristics differ between the anionic sponge and non-anionic sponge, cleaning results thereof differ even when the same grains are used in the same cleaning environment. For example, in the case where under a condition of being on the acidic side (in an environment of less than pH 7), the zeta potential of the grains is negative, the zeta potentials of the anionic sponge and the non-anionic sponge are respectively negative, and the zeta potentials of the anionic sponge are lower than those of the non-anionic sponge (absolute value of the zeta potentials of the anionic sponge is greater than that of the zeta potentials of the non-anionic sponge), repulsive force acting between the anionic sponge and the grains is increased greater than that acting between the non-anionic sponge and the grains. As a result, comparison of the cases of cleaning using the aforementioned anionic sponge and non-anionic sponge under conditions achieving greater cleaning results the greater the repulsive force acting between the sponges and the grains shows that use of the anionic sponge had improved cleaning results over use of the non-anionic sponge.

Accordingly, cleaning efficiency during the cleaning step may be improved without excessive brushing and cleaning by firmly pressing the cleaning sponge against the surface to be cleaned.

Furthermore, a cleaning sponge according to a second aspect of the present invention is configured by a polyvinyl acetal porous resin material having elasticity in a wet state for rubbing against a surface to be cleaned so as to clean that surface. The polyvinyl acetal porous resin material contains a cationic functional group.

The sponge may have a roller form including an approximately cylindrical roller and multiple protrusions formed integrally on the outer surface of the roller, as with the first aspect. In this case, the surface to be cleaned is cleaned by rotating the protrusions to touch that surface.

The cationic functional group preferably includes at least one of an amino group, an imino group, and a biguanide group, where it is particularly preferable to include an amino group.

Alternatively, zeta potential of the polyvinyl acetal porous resin material may be positive under a condition of being on the mildly alkaline to acidic side (in an environment of pH 8 or less).

During scrub cleaning using the cleaning sponge, as with the first aspect, the cleaning sponge is rubbed against the surface to be cleaned while supplying various cleaning liquids to that surface. Moreover, the zeta potential of the cleaning sponge (polyvinyl acetal porous resin material) and the zeta potential of the respective grains change respectively in accordance with the pH of the cleaning liquid, as with the first aspect.

In this case, since the polyvinyl acetal porous resin material constituting the cleaning sponge according to the second aspect of the present invention contains a cationic functional group, polyvinyl acetal porous resin material not containing a cationic functional group has different correspondence to pH and zeta potentials (zeta potential characteristics). For example, in a certain cleaning environment, in the case where the zeta potential of the cleaning sponge containing a cationic functional group (referred to as cationic cleaning sponge hereafter) and zeta potential of the cleaning sponge not containing a cationic functional group (referred to as non-cationic cleaning sponge hereafter) are homopolar (either both positive or negative) and the absolute value of the zeta value of the cationic cleaning sponge is greater than that of the non-cationic cleaning sponge, the repulsive force or the adsorptivity acting between the cationic sponge and the grains is greater than that acting between the non-cationic sponge and the grains. Moreover, in a certain cleaning environment, in the case where the zeta potentials of the cationic cleaning sponge and the non-cationic cleaning sponge are heteropolar (one is positive and the other is negative), if the zeta potentials of the cationic cleaning sponge and the grains are homopolar, a repulsive force acts between the cationic sponge and the grains and adsorptivity acts between the non-cationic sponge and the grains, and if the zeta potentials of the cationic cleaning sponge and the grains are heteropolar, adsorptivity acts between the cationic sponge and the grains and a repulsive force acts between the non-cationic sponge and the grains In this manner, since zeta potential characteristics differ between the cationic sponge and non-cationic sponge, cleaning results thereof differ even when the same grains are used in the same cleaning environment. For example, in the case where under a condition of being on the mildly alkaline to acidic side (in an environment of pH 8 or less), the zeta potentials of the grains and the cationic sponge are positive, and the zeta potential of the non-cationic sponge is negative, repulsive force acts between the cationic sponge and the grains, and adsorptivity acts between the non-cationic sponge and the grains. As a result, comparison of the cases of cleaning using the aforementioned cationic sponge and non-cationic sponge under conditions achieving greater cleaning results from the repulsive force acting between the sponges and the grains than from the adsorptivity acting therebetween shows that use of the cationic sponge had improved cleaning results more than use of the non-cationic sponge. Moreover, in the case where under a condition of being on the mildly alkaline to acidic side (in an environment of pH 8 or less), the zeta potential of the cationic sponge is negative and the zeta potentials of the grains and the non-cationic sponge are respectively negative, adsorptivity acts between the cationic sponge and the grains, and repulsive force acts between the non-cationic sponge and the grains. As a result, comparison of the cases of cleaning using the aforementioned cationic sponge and non-cationic sponge under conditions achieving greater cleaning results from the adsorptivity acting between the sponges and the grains than from the repulsive force acting therebetween shows that use of the cationic sponge had improved cleaning results more than use of the non-cationic sponge.

Accordingly, cleaning efficiency during the cleaning step may be improved without excessive brushing and cleaning by firmly pressing the cleaning sponge against the surface to be cleaned.

Result of Invention

According to the present invention, improvement in efficiency of cleaning during the cleaning process and reduction in damage of an object to be cleaned may be achieved.

DESCRIPTION OF REFERENCE NUMERALS

1 . . . sponge roller (cleaning sponge), 2 . . . rotary axis, 3 . . . roller, 3a . . . outer surface, 4 . . . outer skin layer, 5 . . . protrusion, 5a . . . top outer surface (interior exposed surface), 5b . . . outer surface, 5c . . . slanted face (interior exposed surface), 10 . . . object to be cleaned, 10a . . . surface to be cleaned, 51 . . . cleaning sponge

DETAILED DESCRIPTION OF THE INVENTION

A sponge roller as a cleaning sponge according to a first embodiment of the present invention will be described based on the drawings.

Figure 1:
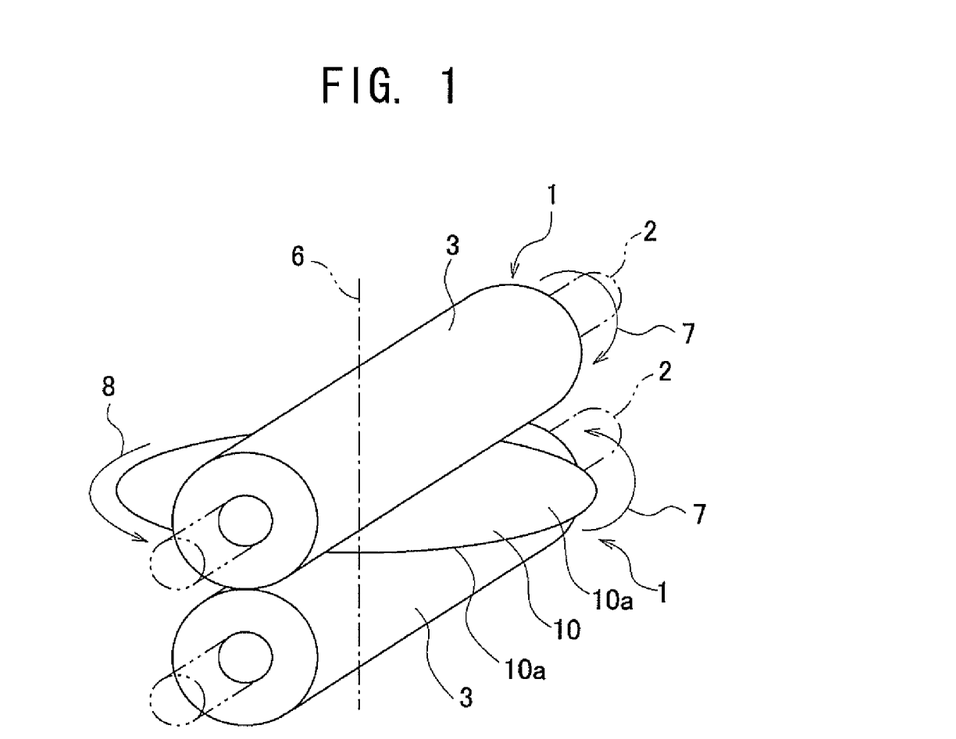
FIG. 1 is a perspective view illustrative of cleaning surfaces to be cleaned using sponge rollers.
Figure 2:
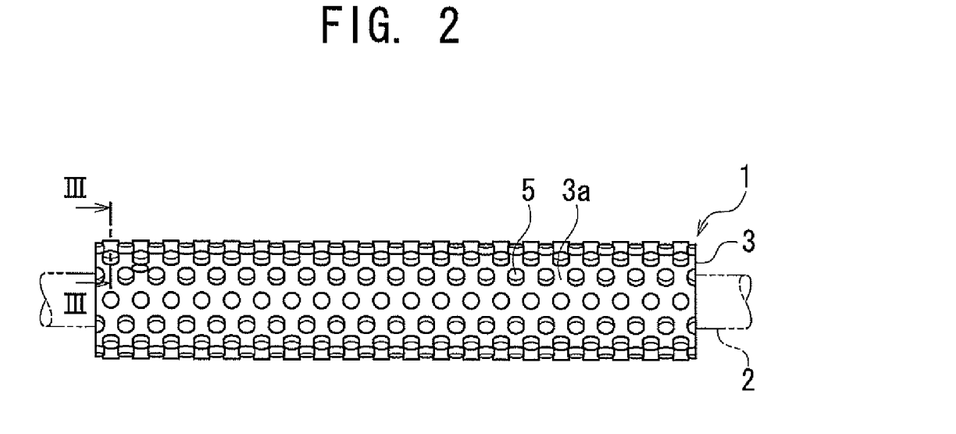
FIG. 2 is a side view of the sponge roller of FIG. 1.
Figure 3:
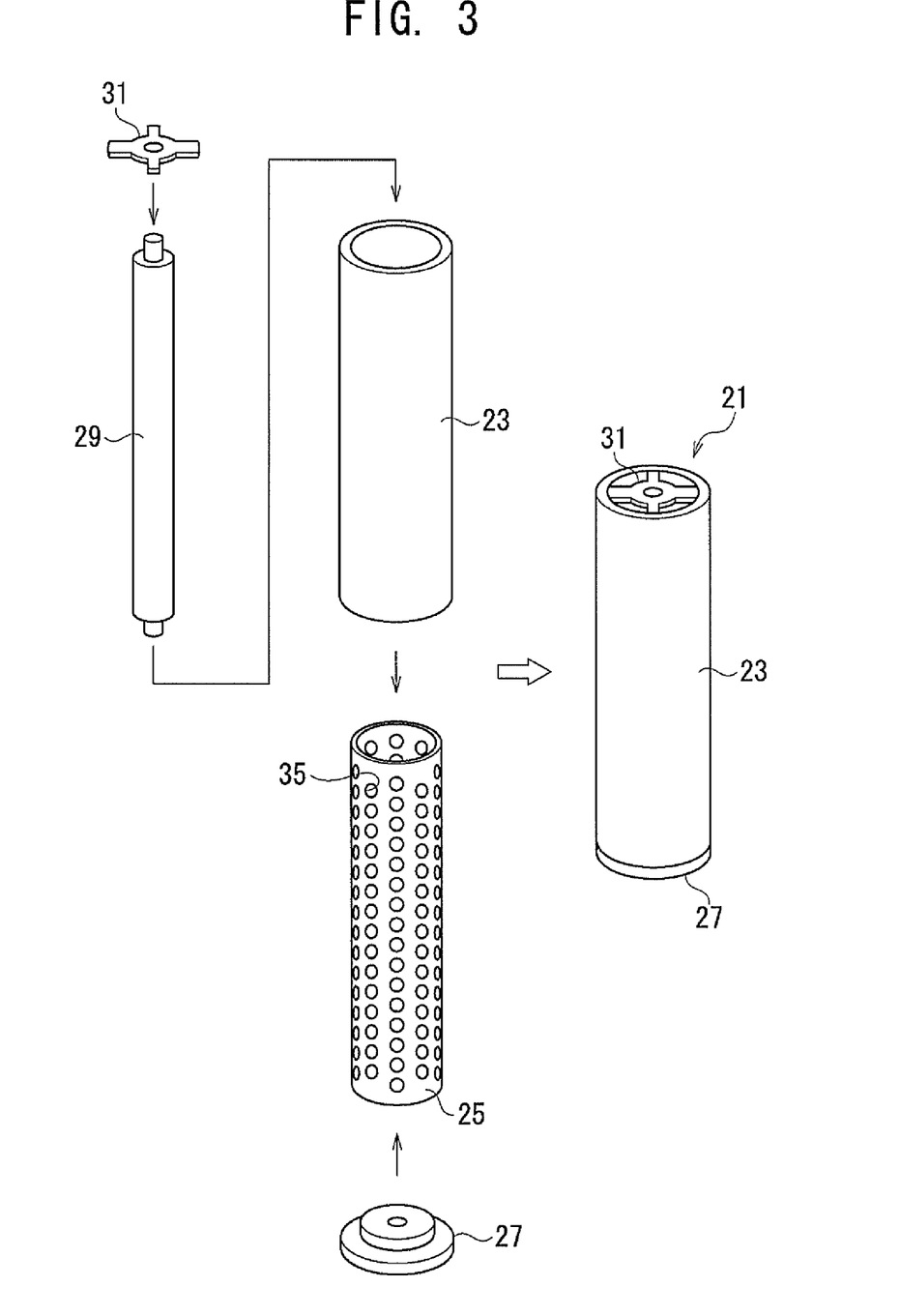
FIG. 3 is a perspective view illustrative of a mold for shaping the sponge roller of FIG. 2.
Figure 4:
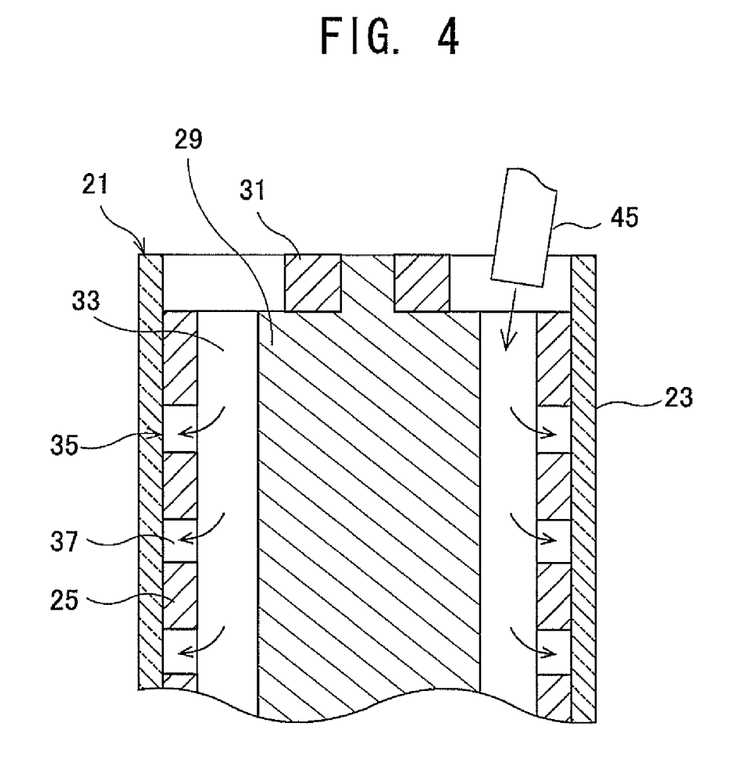
FIG. 4 is cross-sectional view illustrative of a method of manufacturing the sponge roller of FIG. 2.

FIG. 1 is a perspective view illustrative of cleaning surfaces to be cleaned using sponge rollers. FIG. 2 is a side view of the sponge roller of FIG. 1. FIG. 3 is a perspective view illustrative of a mold for shaping the sponge roller of FIG. 2. FIG. 4 is cross-sectional view illustrative of a method of manufacturing the sponge roller of FIG. 2. Note that illustration of protrusions is omitted in FIG. 1.

As shown in FIG. 1 and FIG. 2, a target object to be cleaned 10 subject to scrub cleaning is a thin disc wafer, and surfaces to be cleaned 10a are the top surface and the rear surface of the object to be cleaned 10.

Each of paired upper and lower sponge rollers 1 for scrub cleaning has an approximately cylindrical roller 3, and multiple protrusions 5 formed integrally on an outer peripheral surface 3a of the roller 3. Each of the protrusions 5 has a top outer surface 5a and an outer peripheral surface 5b. An approximately columnar rotary axis 2 made of a hard material such as metal or plastic is attached to each of the rollers 3. Note that the form of the protrusions 5 is not limited to a cylindrical shape.

Scrub cleaning is carried out by arranging the upper and lower rotary axes 2 roughly parallel at a predetermined distance apart, sandwiching the object to be cleaned 10 between the upper and lower rollers 3 (between the protrusions 5 of the upper roller 3 and protrusions 5 of the lower roller 3) in a state where the surfaces to be cleaned 10a are arranged roughly parallel to the rotary axes 2, supplying various cleaning liquids onto the surfaces to be cleaned 10a, rotating (rotative direction is indicated by arrows 7) the respective rotary axes 2, and rotating (rotative direction indicated by arrow 8) the surfaces to be cleaned 10a around a rotary axis 6, which is approximately orthogonal to the rotary axes 2. Namely, the surfaces to be cleaned 10a are scrub-cleaned by the top outer surfaces 5a of the protrusions 5 on the rollers 3 rotating and making contact with the rotating surfaces to be cleaned 10a.

Scrub cleaning is processing carried out for removing from the surfaces to be cleaned 10a particles mainly of a slurry abrasive remaining on the surfaces to be cleaned 10a after chemical mechanical polishing (CMP) of the surfaces using the slurry abrasive and an urethane pad or the like.

Purified water, an alkaline solution (e.g., ammonia water), or an acidic solution (e.g., dilute fluorinated acid) is used as a cleaning liquid. Moreover, $SiO_2$, $Al_2O_3$, $CeO_2$, $MnO_3$ and the like are used as grains in the abrasive supplied during CMP.

Note that arrangement of the paired sponge rollers 1 are not limited to the aforementioned upper and lower positions; and for example, the paired sponge rollers 1 may be arranged in various modes, such as erecting and placing them on the left and right, placing them on the left and right horizontally, or arranging them in an oblique direction. Furthermore, the rotary axis 6 of the object to be cleaned 10 should be set to be approximately orthogonal to the rotary axes 2 of the sponge rollers 1. When a wafer or the object to be cleaned 10 is arranged vertically and the paired sponge rollers 1 are positioned left and right horizontally for pinching the wafer, the sponge rollers 1 may be rotated in a downward direction (i.e. direction in which a downward force is applied while the sponge rollers 1 pinch the wafer) while touching (cleaning) the wafer.

The sponge rollers 1 (the rollers 3 and the protrusions 5) are made of a polyvinyl acetal porous resin material (PVAt porous resin material), which is elastic in a moist state. The PVAt porous resin material is hard in a dry state and soft in a wet state. Moreover, the PVAt porous resin material has excellent water-absorbing, water-holding, and wear-resistance properties, and exhibits favorable flexibility and moderate rebound resilience when wet.

Furthermore, the PVAt porous resin material contains an anionic functional group. The anionic functional group preferably includes at least one of a carboxyl group, a sulfo group, a sulfate group, and a phosphate group, where it is particularly preferable to include a carboxyl group.

The rotary axes 2 are inserted through inside of the rollers 3, respectively, supporting the rollers 3 in a fixed manner. For example, the outer peripheral surfaces of the rotary axes 2 may be fixed to the respective inner peripheral surface of the rollers 3 using an adhesive, or alternatively, by forming the external diameter of the rotary axes 2 larger than internal diameter of the rollers 3, and pressing the rotary axes 2 inside of the rollers 3, respectively, the rollers 3 may be supported in a fixed manner by the respective rotary axes 2 due to elastic force of the rollers 3. Further alternatively, when manufacturing the roller 3, the roller 3 may be fixed or supported by the rotary axis 2 by using a core rod 29 shown in FIG. 3 instead of the rotary axis 2. In this case, the sponge roller 1 (roller 3) after a reaction is removed from a mold 21 as is in a state attached to the rotary axis 2 and then rinsed. Through such fixed support, the roller 3 is rotated along with the rotary axis 2.

The sponge roller 1 made of a PVAt porous resin material is produced by making an aqueous solution from one type or mixture of polyvinyl alcohol (raw material) having an average degree of polymerization of 500 to 3000 and a saponification degree of 80% or greater, for example, adding to this aqueous solution an aldehyde as a cross-linker, a mineral acid as a catalyzer, and amylum as an air hole forming material, injecting the resulting compound liquid into a predetermined mold 21 shown in FIG. 3 and FIG. 4, letting them react with each other at 40 to 80 degrees C., removing them from the mold 21, and removing the air hole forming material and the like by rinsing in water.

The mold 21 has an outer mold 23, an inner mold 25, a bottom plate 27, the core rod 29, and a cap 31. The outer mold 23 and the inner mold 25 are both formed in a cylindrical shape. The inner mold 25 has an outer diameter equal to or slightly smaller than the inner diameter of the outer mold 23, and is inserted into the outer mold 23. The core rod 29 is inserted almost in the center of the inner mold 25. The bottom plate 27 closes the bottom ends of the outer mold 23 and the inner mold 25, and supports the bottom end of the core rod 29. The cap 31 is joined to the inner peripheral surface at the upper edge of the outer mold 23. The core rod 29 is positioned according to the bottom plate 27 and the cap 31.

Approximately cylindrical open spaces 33, which are for forming the rollers 3, are partitioned off between the inner peripheral surface of the inner mold 25 and the outer peripheral surface of the core rod 29. Multiple through-holes 35 for forming the protrusions are formed in the inner mold 25, and the respective through-holes 35 connect to the open spaces 33. The compound liquid is injected into the open spaces 33 from a casting nozzle 43 that is inserted between the outer mold 23 and the cap 31, flowing into the through-holes 35 from the open spaces 33. Simultaneously, air within the through-holes 35 is moved to the open spaces 33 and then discharged to the air from the upper end of the open spaces 33. Accordingly, the compound liquid is filled surely to the ends of the through-holes 35.

The anionic functional group may be contained in advance in polyvinyl alcohol (PVA) or raw material, or it may be added to the sponge rollers 1 once the material is removed from the mold 21 and rinsed. The PVA containing the anionic functional group may be a fully or partially saponified object. PVAs containing multiple different anionic functional groups may be mixed, or PVAs not containing an anionic functional group may be mixed. Alternatively, PVAs differing in degree of polymerization may be blended and used, and not being limited to the PVAs within the above degree of polymerization, a PVA having a degree of polymerization of 1500 and PVA having a degree of polymerization of 300 may be mixed and used.

30% compressive stress (property value) of the sponge roller 1 in a proper moist state is preferably no less than 2 kPa and no greater than 20 kPa. Proper moist state indicates a moist state in which the PVAt porous resin material achieves an appropriate elasticity, and moisture content (percentage in weight in moist state relative to dry state) is between approximately 120% to 1500%. Moreover, 30% compressive stress is calculated by cutting the PVAt porous resin material in the proper moist state such that distance (height in a longitudinal direction) between both ends is 30 mm, setting it on a digital load measuring instrument so that a load is applied across the entire end, measuring load when pressing down by 30% (9 mm) in the longitudinal direction, and dividing the measure load by the area of the end.

The PVAt porous resin material preferably has a porosity of the internal structure of 80% or greater and 95% or less, and an average air hole diameter of 50 µm or greater and 200 µm or less.

This is because if the porosity is under 80%, flexibility when wet is insufficient, and if the porosity is greater than 95%, it lacks in practical strength, and is thus unsuited for cleaning use in either way. Moreover, this is because if the average air hole diameter is smaller than 50 µm, elasticity when wet is inadequate and sufficient brushing effect cannot be achieved; if it exceeds 200 µm, the holes are too large and are inappropriate for precision cleaning.

The aforementioned porosity is a value obtained by measuring the true volume of a rectangular parallelpiped PVAt porous resin material in a dry state, which is sufficiently dried using a dryer, using a dry type automatic densimeter and calculating the following equation (1) from apparent volume and true volume of the rectangular parallelpiped.

$$\text{Porosity (\%)} = (\text{apparent volume} - \text{true volume})/\text{apparent volume} \times 100 \quad (1)$$

The aforementioned average air hole diameter is an average value of diameters of the multiple air holes formed in the internal structure of the PVAt porous resin material. In this embodiment, the average value of sizes (major axis in a longitudinal direction of each of the air holes) of a predetermined number of air holes selected according to a predefined standard from the multiple air holes is defined as the average air hole diameter, which may be found through the following measuring method, for example.

Cut the sponge roller 1 at a predetermined position, and then photograph the internal composition exposed at that cut surface using an electron microscope. Next, set a predetermined measuring range on the photographed picture, and extract twenty air holes from the multiple air holes existing in the measuring range in decreasing order of major axis. Measure the major axes of the respective twenty extracted air holes. Calculate as the average air hole diameter the average of the measured values from the eleventh to the twentieth of the twenty measured values arranged in decreasing order.

Moreover, the PVAt porous resin material preferably has an apparent density of 0.06 g/cm³ or greater, and a water retention value of 600% or greater.

The aforementioned apparent density is found by measuring weight (dry weight) of the PVAt porous resin material in a predetermined shape (e.g., rectangle) in a dry state and outer dimensions thereof in a proper moist state, calculating volume (wet volume) from the outer dimensions, and dividing the measured dry weight by the calculated wet volume.

Furthermore, the water retention value is found by measuring weight (dry weight) of the PVAt porous resin material in a dry state and weight (wet weight) thereof in a state containing a sufficient amount of water, and then calculating the following equation (2).

$$\text{Water retention value (\%)} = (\text{wet volume} - \text{dry volume})/\text{dry volume} \times 100 \quad (2)$$

Next, the zeta potential of the PVAt porous resin material and the zeta potential of the respective grains are described.

The zeta potential of the PVAt porous resin material and the zeta potential of the respective grains change respectively in accordance with the pH of the cleaning liquid. Under a predetermined condition (in an environment where the cleaning liquid has a predetermined pH), an electrical repulsive force acts between the grains and the surfaces (surfaces of the protrusions 5) of the sponge rollers 1 if the zeta potential of the PVAt porous material and the zeta potential of the respective grains are homopolar (either both positive or negative), and electrical adsorptivity acts if they are heteropolar (one is positive and the other is negative). The greater electrical repulsive force and electrical adsorptivity, the larger the absolute value of the zeta potential of the sponge rollers 1. Moreover, chemical repulsive force and adsorptivity also act between the grains and the surfaces of the sponge rollers 1, and such electrical and chemical repulsive force or adsorptivity is utilized so as to scrub clean.

Furthermore, the relationship between pH and zeta potential of the PVAt porous resin material differs in cases of containing an anionic functional group and not containing an anionic functional group.

Figure 5:
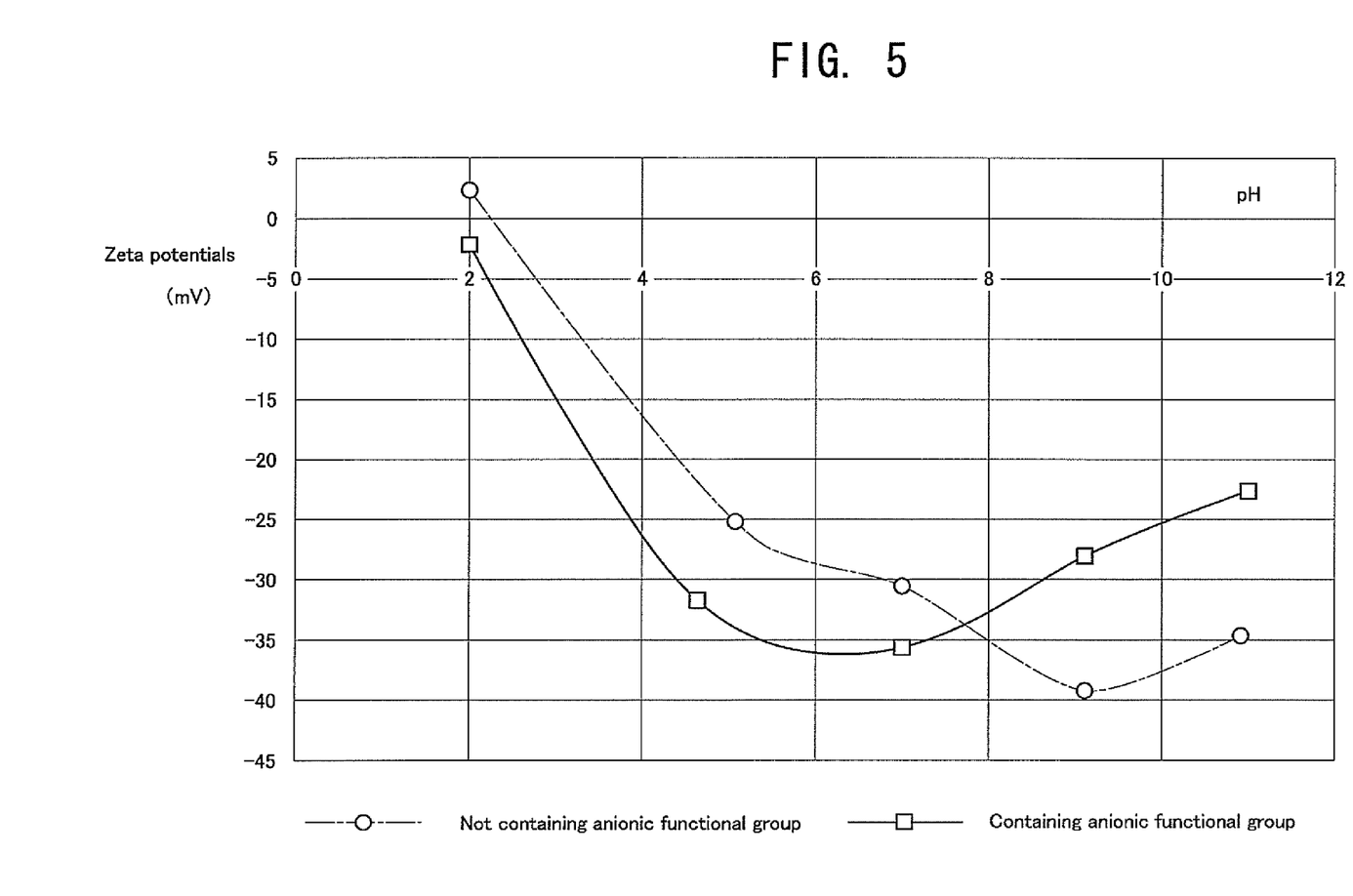
FIG. 5 is a graph showing an example of zeta potential characteristics of an anionic sponge and of a non-anionic sponge.

An example of correspondence between pH and zeta potential of a PVAt porous resin material containing a carboxyl group as an anionic functional group (zeta potential characteristics of an anionic sponge) and correspondence between pH and zeta potential of a PVAt porous resin material not containing an anionic functional group (zeta potential characteristics of a non-anionic sponge) are illustrated in FIG. 5.

In the example of FIG. 5, the zeta potential of the non-anionic sponge is 2.5 mV at pH 2, and once it decreases as the alkalinity increases, exhibiting a minimum value (approximately −40 mV) near pH 9, it then reverses and rises. On the other hand, the zeta potential of the anionic sponge is −3 mV at pH 2, and once it decreases as the alkalinity increases, exhibiting a minimum value (approximately −36 mV) near pH 6, it then reverses and rises.

Figure 6:
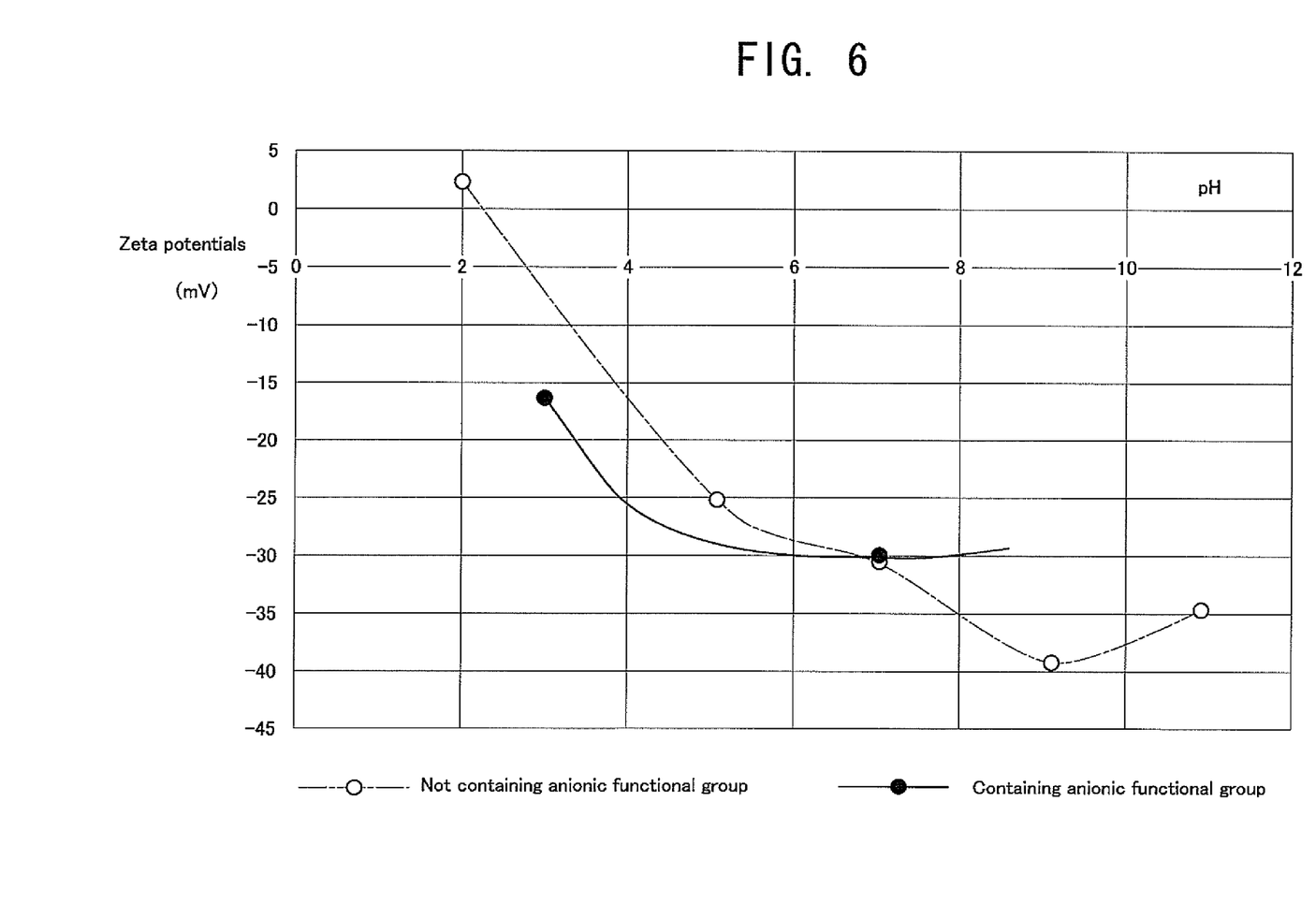
FIG. 6 is a graph showing another example of zeta potential characteristics of an anionic sponge and of a non-anionic sponge.

Another example of zeta potential characteristics of an anionic sponge is described next with reference to FIG. 6. The example of FIG. 6 shows zeta potential characteristics of an anionic sponge containing a sulfo group as an anionic functional group, where the zeta potential of the anionic sponge is −16 mV at pH 3, and once it decreases as the alkalinity increases, exhibiting a minimum value (approximately −30 mV) near pH 7, it reverses and rises. Comparison of the zeta potential characteristics of the anionic sponge given in FIG. 5 and the zeta potential characteristics of the anionic sponge given in FIG. 6 shows that the anionic sponge of FIG. 6 has a lower zeta potential than the anionic sponge of FIG. 5 in the stronger acidity region than the vicinity of pH 4, and the anionic sponge of FIG. 5 has a lower zeta potential than the anionic sponge of FIG. 6 in the weaker acidity region than the vicinity of pH 4. Note that the zeta potential characteristics of the non-anionic sponge given in FIG. 6 are the same as those given in FIG. 5.

Comparison of the zeta potentials of the anionic sponges and the zeta potentials of the non-anionic sponges given in the above examples of FIG. 5 and FIG. 6 shows that the zeta potentials of the anionic sponges are lower than the those of the non-anionic sponges on the acidic side (less than pH 7), and the magnitude relation of them between pH 7 and pH 8 inclusive is reversed, where the zeta potentials of the anionic sponges are higher than the those of the non-anionic sponges on the alkaline side of a pH of 8 or greater.

Figure 7:
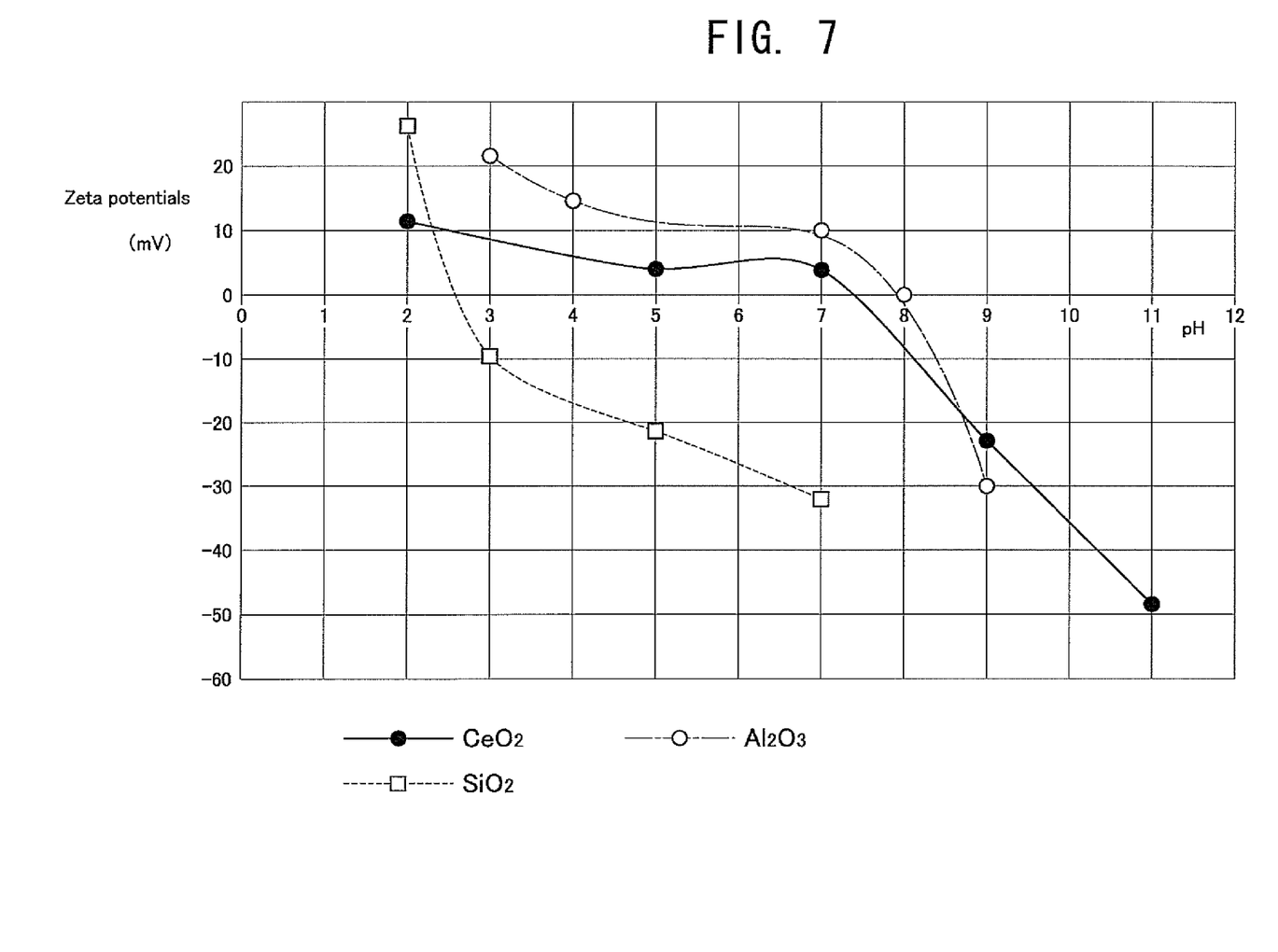
FIG. 7 is a graph showing relationship between pH and zeta potentials of respective grains.

FIG. 7 is a graph showing an example of relationship between pH and zeta potentials of respective grains.

As in FIG. 7, the zeta potentials of $SiO_2$ are minus values on the acidic side of pH 3 to 7. The zeta potentials of $Al_2O_3$ and $CeO_2$ are positive values on the acidic side of less than pH 7 and negative values on the alkaline side of pH 8 or greater.

The zeta potentials of the anionic sponges given in FIG. 5 and FIG. 6 show that on the acidic side of less than pH7 the zeta potentials of the anionic sponges as described above are both positive, and the zeta potentials of the anionic sponges are lower than zeta potentials of the non-anionic sponges (absolute value is large). As a result, in the case of using $Al_2O_3$ or $CeO_2$ as grains in an acidic cleaning environment of less than pH 7, since the zeta potentials of the sponges are negative and those of the grains are positive, adsorptivity acts between the sponge and the grains. However, due to the zeta potential absolute value of the anionic sponge being greater than that of the non-anionic sponge, the adsorptivity acting between the anionic sponge and the grains is greater than that acting between the non-anionic sponge and the grains. Moreover, in the case of using $SiO_2$ as grains for the sponges in the above-given acidic cleaning environment, since the zeta potentials of the sponges and those of the grains are negative, repulsive force acts between the sponges and the grains. However, due to the zeta potential absolute value of the anionic sponge being greater than that of the non-anionic sponge, the repulsive force acting between the anionic sponge and the grains is greater than that acting between the non-anionic sponge and the grains. As a result, comparison of the cases of cleaning using the aforementioned anionic sponge and non-anionic sponge under conditions achieving greater cleaning results as the repulsive force or adsorptivity acting between the sponges and the grains is greater shows that use of the anionic sponge had improved cleaning results more than use of the non-anionic sponge.

Moreover, even when the sponges themselves disengage and flow out as particles, the larger the absolute value of the zeta potentials of the sponges themselves, the stronger they repel each other, clumping together of the disengaged sponges does not occur easily, and the particles easily flow out along with the cleaning liquid, thereby little remaining on the wafer.

As described above, since the PVAt porous resin material constituting the sponge rollers 1 contains an anionic functional group in this embodiment, the PVAt porous resin material not containing an anionic functional group has different zeta potential characteristics. As a result, setting a cleaning environment (selecting a cleaning liquid) in which the absolute value of zeta potentials of the anionic sponges are greater than absolute value of zeta potentials of the non-anionic sponges, and scrub-cleaning in this environment under conditions (e.g., operating conditions) by which greater cleaning results are achieved the greater the repulsive force and adsorptivity acting between the sponges and the grains allow greater increase in the repulsive force or adsorptivity acting between the anionic sponges and the grains than that acting between the non-anionic sponges and the grains.

Accordingly, cleaning efficiency during the cleaning step may be improved without excessive brushing and cleaning by firmly pressing the sponge rollers 1 against the surfaces to be cleaned.

A second embodiment of the present invention is described next. A PVAt porous resin material according to this embodiment contains a cationic functional group instead of the aforementioned anionic functional group. The cationic functional group preferably includes at least one of an amino group, an imino group, and a biguanide group, where it is particularly preferable to includes an amino group.

The cationic functional group may be contained in advance in polyvinyl alcohol (PVA) or raw material, or it may be added to the sponge rollers 1 once the material is removed from the mold 21 and rinsed, as in the case of the aforementioned anionic functional group. The PVA containing the cationic functional group may be fully saponified or partially saponified object. A PVA containing multiple different cationic functional groups may be mixed, or a PVA not containing a cationic functional group may be mixed. Alternatively, PVAs differing in degree of polymerization may be blended and used, or a PVA having a degree of polymerization of 1500 and PVA having a degree of polymerization of 300 may be mixed and used.

The relationship between pH and the zeta potential of the PVAt porous resin material differs in the cases of containing a cationic functional group and not containing a cationic functional group.

Figure 8:
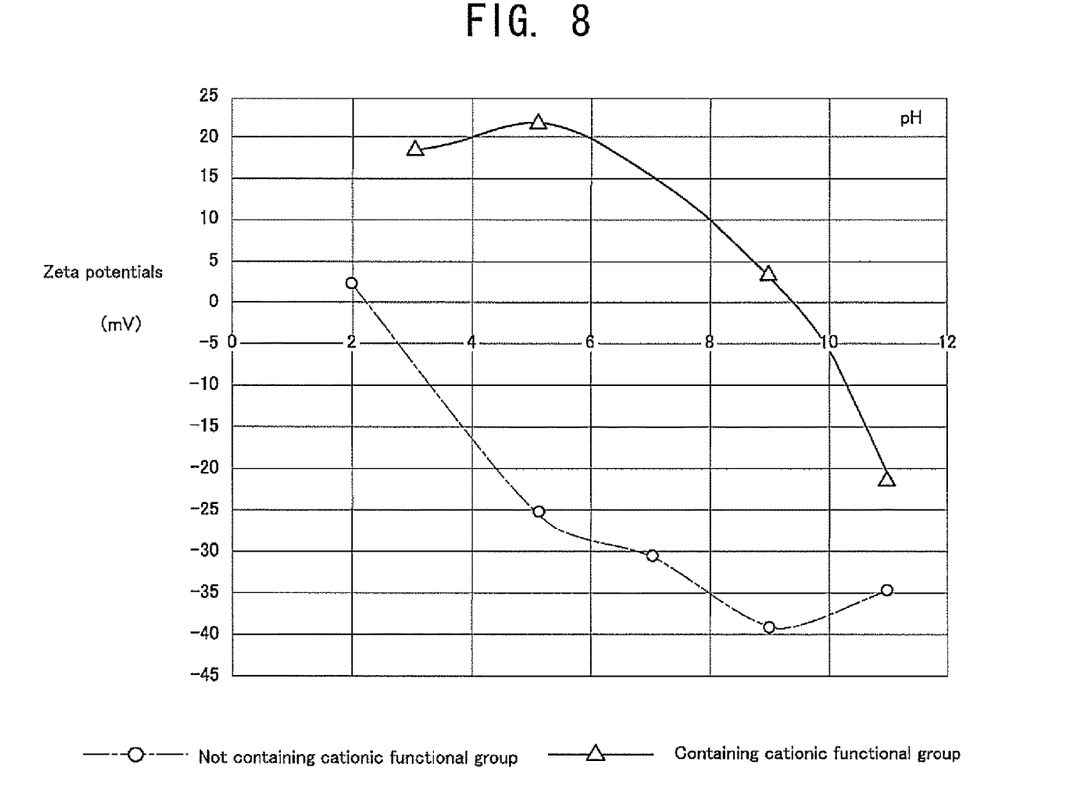
FIG. 8 is a graph showing zeta potential characteristics of a cationic sponge and of a non-cationic sponge.

An example of correspondence between pH and the zeta potential of a PVAt porous resin material containing an amino group as a cationic functional group (zeta potential characteristics of a cationic sponge) and correspondence between pH and the zeta potential of a PVAt porous resin material not containing a cationic functional group (zeta potential characteristics of a non-cationic sponge) are illustrated in FIG. 8.

In the example of FIG. 8, the zeta potential of the cationic sponge is approximately +18 mV at pH 3, and once it increases as the alkalinity increases, exhibiting a maximum value (approximately +22 mV) near pH 5, it reverses and drops negative near pH 8.5. Note that the zeta potential characteristics of the non-cationic sponge given in FIG. 8 are the same as those of the zeta potential characteristics of the non-cationic sponge in FIG. 5.

In the example of FIG. 8, comparison of the zeta potential characteristics of the cationic sponge and the zeta potential characteristics of the non-cationic sponge shows that the zeta potentials of the cationic sponge are positive on the mildly alkaline to acidic side (pH 3 or greater and pH 8 or less), and zeta potentials of the non-cationic sponge are negative. In other words, the case of using $Al_2O_3$ or $CeO_2$ illustrated in FIG. 6 as grains in a cleaning environment on the mildly alkaline to acidic side of pH 3 or greater and pH 8 or less shows that the zeta potentials of the cationic sponge and the grains are respectively positive, and the zeta potentials of the non-cationic sponge are negative. Thus, a repulsive force acts between the cationic sponge and the grains, and adsorptivity acts between the non-cationic sponge and the grains. As a result, comparison of the cases of cleaning using the aforementioned cationic sponge and non-cationic sponge under conditions achieving greater cleaning results when the repulsive force acts between the sponges and the grains rather than when adsorptivity acts therebetween shows that use of the cationic sponge provides greater improved cleaning results than use of the non-cationic sponge.

As such, setting up a cleaning environment (selecting a cleaning liquid) in which the zeta potentials of the cationic sponge and the grains are positive, and the zeta potentials of the non-cationic sponge are negative, and scrub-cleaning in this environment under conditions (e.g., operating conditions) by which greater cleaning results from a repulsive force than adsorptivity are achieved allows the cationic sponge to exhibit greater improved cleaning results than those by the non-cationic sponge. Accordingly, cleaning efficiency during the cleaning step may be improved without brushing and cleaning by excessively firmly pressing the sponge rollers 1 against the surfaces to be cleaned.

Furthermore, the case of using $SiO_2$ illustrated in FIG. 6 as grains in the aforementioned cleaning environment on the mildly alkaline to acidic side shows that the zeta potentials of the cationic sponge are negative, and the zeta potentials of the non-cationic sponge and the grains are respectively positive. Thus, adsorptivity acts between the cationic sponge and the grains, and repulsive force acts between the non-cationic sponge and the grains. As a result, comparison of the cases of cleaning using the aforementioned cationic sponge and non-cationic sponge under conditions achieving greater cleaning results when the adsorptivity acts between the sponges and the grains rather than when repulsive force acts therebetween shows that use of the cationic sponge had improved cleaning results over use of the non-cationic sponge.

As such, by setting up a cleaning environment (selecting a cleaning liquid) in which the zeta potentials of the cationic sponge are positive and the zeta potentials of the non-cationic sponge and the grains are negative, and scrub-cleaning in this environment under conditions (e.g., operating conditions) by which greater cleaning results from a repulsive force than adsorptivity are achieved, the cationic sponge exhibits improved cleaning results over those by the non-cationic sponge. Accordingly, cleaning efficiency during the cleaning step may be improved without brushing and cleaning by excessively firmly pressing the sponge rollers 1 against the surfaces to be cleaned.

Note that the present invention is not limited to the above-given embodiment and modifications thereof described merely as an example, and aside from the above embodiment and the like, various changes in accordance with design may be made without departing from the technical spirit or scope of the present invention.

Figure 9:
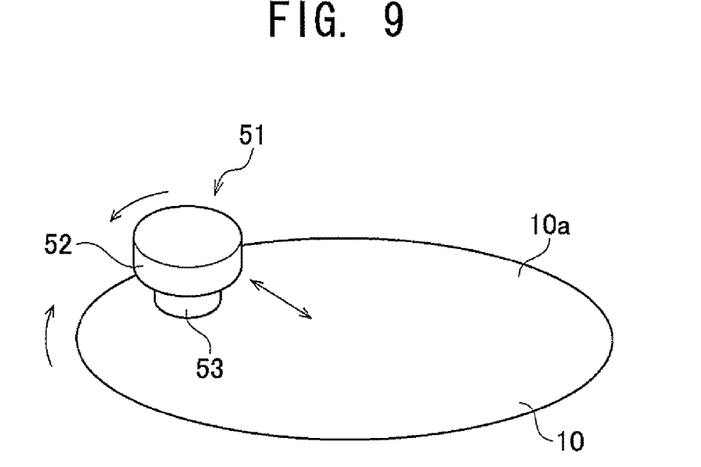
FIG. 9 is a perspective view illustrative of another example of a cleaning sponge.

For example, while in the above embodiment, the sponge rollers 1 including multiple protrusions 5 on the outer peripheral surfaces 3a of the approximately cylindrical rollers 3 has been exemplified as a cleaning sponge, the form of the cleaning sponge is not limited hereto, various forms such as a sponge roller made up of an approximately cylindrical roller not including protrusions, a cleaning sponge 51 integrated with a protrusion 53 protruding from a tabular base 52 as shown in FIG. 9, or the like may be employed. Note that with the cleaning sponge 51 of FIG. 9, the protrusion 53 is rubbed against a surface to be cleaned 10a by gripping the tabular base 52 and rotating it while moving along the radius of the surface to be cleaned 10a, and rotating a body to be cleaned 10 in the same or opposite direction as the tabular base 52. Alternatively, the cleaning sponge may be formed in a desired shape by breaking or cutting a block PVAt porous resin material.

INDUSTRIAL APPLICABILITY

The present invention is widely applicable to cleaning sponges and cleaning methods.

What is claimed is:
1. A method for removing particles from a surface, the method comprising:
   providing a cleaning sponge made of an anionic polyvinyl acetal porous resin material that comprises an anionic functional group and has a zeta potential, wherein:
     in a cleaning environment where the pH is acidic, an absolute value of the zeta potential of the anionic polyvinyl acetal porous resin material increases as the pH increases; and
     in a cleaning environment where the pH is basic, an absolute value of the zeta potential of the anionic polyvinyl acetal porous resin material decreases as the pH increases;
   providing the cleaning environment where the pH is acidic by supplying cleaning fluid of an acidic pH to at least one of the surface and the cleaning sponge; and
   placing the cleaning sponge against the surface to provide for removing the particles via adsorption or repulsion.
2. The method as in claim 1, wherein removing the particles comprises removing an abrasive used in chemical mechanical polishing (CMP).

3. The method as in claim 1, wherein removing the particles comprises removing particles comprising at least one of $SiO_2$, $Al_2O_3$, $CeO_2$ and $Mn_2O_3$.

4. The method as in claim 1, wherein the pH is predetermined according to at least one of the absorption and the repulsion between the cleaning sponge and the particles.

5. The method as in claim 1, wherein the cleaning solution comprises at least one of purified water and an acidic solution.

6. The method as in claim 1, wherein the anionic functional group includes at least one of a carboxyl group, a sulfo group, a sulfate group, and a phosphate group.

7. The method as in claim 1, wherein the anionic polyvinyl acetal porous resin material has a zeta potential of −30 mV or less (as an absolute value of 30 mV or greater) under a condition of pH 7.

8. The method as in claim 1, wherein a thirty percent compressive stress load ranges between 2 kPa and 20 kPa for the cleaning sponge when moistened.

9. The method as in claim 1, wherein:
   the anionic polyvinyl acetal porous resin material has a zeta potential of less than 0 mV under a condition of pH 2, a zeta potential of less than −30 mV under a condition of pH of 5, and a zeta potential of less than −33 mV under a condition of pH 7; and
   the cleaning environment comprises a pH of at least 2 and less than 7.

\* \* \* \* \*